United States Patent
Yamada et al.

[11] Patent Number: 5,666,049
[45] Date of Patent: Sep. 9, 1997

[54] SEMICONDUCTOR TESTING APPARATUS, SEMICONDUCTOR TESTING CIRCUIT CHIP, AND PROBE CARD

[75] Inventors: Toshio Yamada, Osaka; Atsushi Fujiwara, Kyoto; Michihiro Inoue, Nara; Kazuhiro Matsuyama, Osaka, all of Japan

[73] Assignee: Matsushita Electric Industrial Co., Ltd., Osaka, Japan

[21] Appl. No.: 526,216

[22] Filed: Sep. 11, 1995

Related U.S. Application Data

[62] Division of Ser. No. 113,689, Aug. 31, 1993, Pat. No. 5,497,097.

[30] Foreign Application Priority Data

Sep. 1, 1992 [JP] Japan .................. 4-233379
Feb. 24, 1993 [JP] Japan .................. 5-035039
Apr. 5, 1993 [JP] Japan .................. 5-077846

[51] Int. Cl.$^6$ .................................................. G01R 31/28
[52] U.S. Cl. ........................ 324/158.1; 324/754; 324/765
[58] Field of Search ........................ 324/158.1, 754, 324/757, 755, 758, 765; 437/8

[56] References Cited

U.S. PATENT DOCUMENTS 4,585,991 4/1986 Reid et al. .................. 324/757
5,177,439 1/1993 Liu et al. .................. 324/754
5,219,765 6/1993 Yoshida et al. .................. 324/754

Primary Examiner—Ernest F. Karlsen
Attorney, Agent, or Firm—McDermott, Will & Emery

[57] ABSTRACT

The present invention comprises a plurality of semiconductor testing circuit chips 2 having an exclusive function of testing a plurality of one item of semiconductor integrated-circuit chips 1, a computer 3 for controlling the semiconductor testing circuit chips 2 and for collecting the test results, and a motherboard 4 on which the plurality of chips 1 to be tested and the plurality of testing circuit chips 2 are mounted so that the chips 1 to be tested are connected to the testing circuit chips 2. Since the major testing functions are incorporated into the testing circuit chips 2, the computer 3 for collecting the test results can sufficiently be composed of a low-price computer, so that it is possible to greatly lower the price of the semiconductor testing apparatus. By increasing the number of the testing circuit chips 2, it is possible to greatly increase the number of chips which can be tested simultaneously. Consequently, there can be provided a semiconductor testing apparatus which realizes the reduction in price and the increase in number of the semiconductor integrated circuits tested simultaneously, thereby significantly reducing the cost of testing the semiconductor integrated circuits.

4 Claims, 20 Drawing Sheets

FIG. 13(a) TOP VIEW OF PROBE CARD
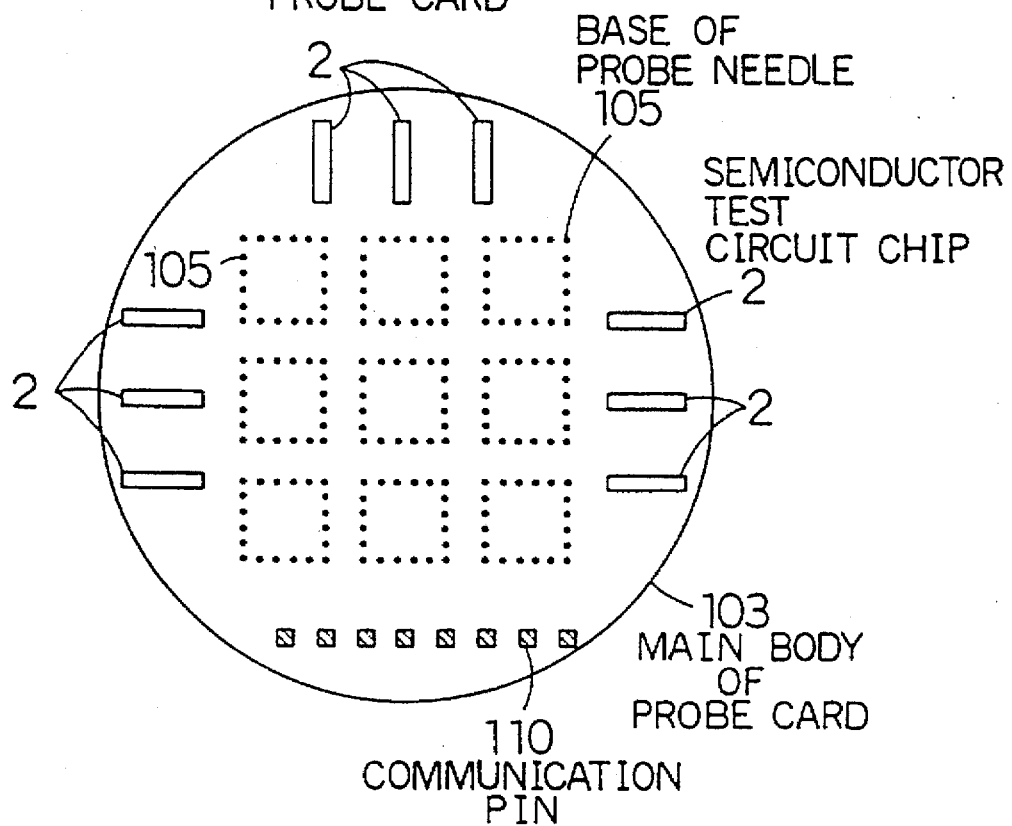
FIG. 13(b) SIDE VIEW OF PROBE CARD
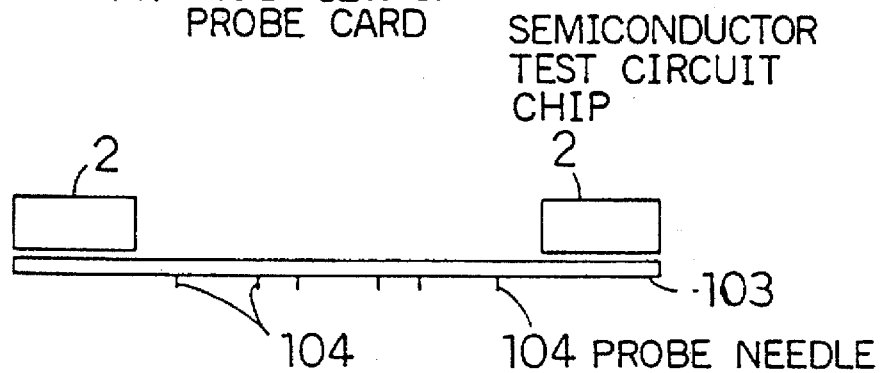

FIG. 14(a) TOP VIEW OF PROBE CARD
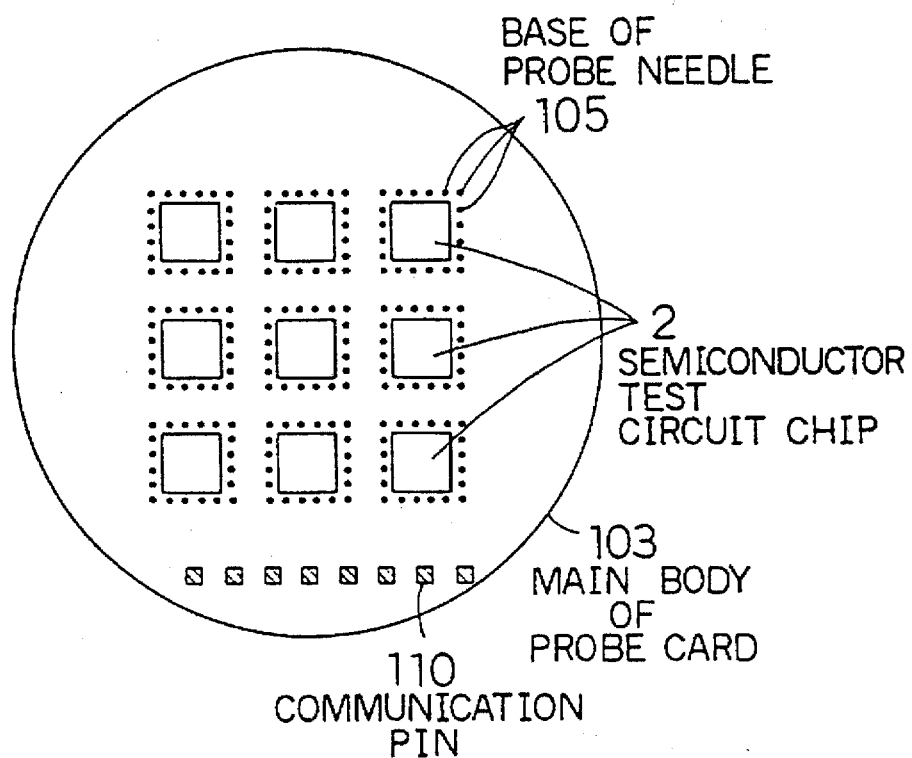
FIG. 14(b) SIDE VIEW OF PROBE CARD
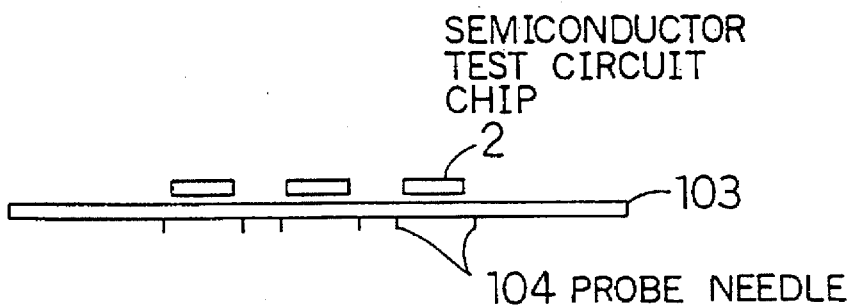

SEMICONDUCTOR TESTING APPARATUS, SEMICONDUCTOR TESTING CIRCUIT CHIP, AND PROBE CARD

This is a divisional of application Ser. No. 08/113,689, filed Aug. 31, 1993 now U.S. Pat. No. 5,497,079.

BACKGROUND OF THE INVENTION

The present invention relates to an improved semiconductor-chip testing apparatus, semiconductor testing circuit chip, and probe card, each of which is used for testing semiconductor integrated circuits.

In recent years, a time period for testing DRAMs has significantly increased due to the increasing capacities thereof or for other reasons. Test-cost reducing technology is a key to the fabrication of DRAMs with a density on the order of 1G bits. DRAMs can be subdivided into the following two types in terms of their applications:

(1) FOM (Function Oriented Memory)

Memories under this category includes ASMs (Application Specified Memories), which are memories developed exclusively for a specific use. A video memory having an image processing function is representative of these memories.

(2) COM (Cost Oriented Memory)

Memories under this category includes versatile memories. There is a possibility that quasi-versatile memories, such as synchronous memories, may fall into this category in future. Since these memories are mass-produced to reduce their costs and prices, the problem of cost reduction is critical to the very future existence of the COMs. Among the costs of producing these memories, a memory-testing period, that is, a time period required for selecting non-defective products out of all the memory chips that were obtained through the semiconductor fabrication processes has considerably increased.

FIG. 19 is a view schematically showing the structure of a conventional test system. According to the test system, one memory tester is used for testing a plurality of semiconductor integrated-circuit chips (DUT: Device Under Test). The conventional test system will be described with reference to the drawing, which shows the main body 351 of the memory tester including a fall bit memory and a controller, a VKT (Video Keyboard Terminal) 352, and a tester head 353 for applying a test voltage to semiconductor integrated circuits under test DUT0 to DUT3. With the conventional test system, however, the ratio of test cost to the total process cost of memory chips will be increasing as shown in FIG. 20. According to the trend graph of FIG. 20, the ratio of test cost will be exceeding 40% in the generation of 1G-bit memory chips, which will make the memory-chip fabrication industry no more profitable. The test-cost trend was determined based on the following data.

As an index for determining the process-cost trend, there were used expected amounts of plant and equipment investment, which are from the data presented by Komiya of Mitsubishi Electric Corporation at the 1991 Joint Meeting of the Institutes of Electricity and Information Engineers. The expected amounts of plant and equipment investment in respective generations are shown as relative values by setting the amount in the 1M-bit generation to 1, which are: 1M(1.0), 4M(2.7), 16M(6.7), 64M(20), 256M(33), and 1G(67). The tester price in each generation was determined on the supposition that it would double at the latest period of each generation. That is, if the tester price in the 1M-bit generation is set to 1, the relative tester prices in respective generations are: M(1), 4M(2), 16M(4), 64M(8), 256M(16), and 1G(32). The test periods in the respective generations were estimated as relative values by setting the test period in the 1M-bit generation to 1, as shown in Table 1, which are: M(1), 4M(3.2), 16M(9.6), 64M(32), 256M(90), and 1G(270).

As the trend of the number of chips which can be tested simultaneously, three cases are assumed as shown in Table 2. The production scale and the number of production items are major factors in determining which case is valid for a specific company.

TABLE 1

|  | 1M | 4M | 16M | 64M | 256M | 1G |
|---|---|---|---|---|---|---|
| CYCLE TIME (ns) | 100 | 80 | 60 | 50 | 40 | 30 |
| CAPACITY | 1 | 4 | 16 | 64 | 256 | 1024 |
| TEST PERIOD RATIO | 1 | 3.2 | 9.6 | 32 | 90 | 270 |

TABLE 2

|  | 1M | 4M | 16M | 64M | 256M | 1G |
|---|---|---|---|---|---|---|
| CASE 1 | 1 | 1 | 1 | 1 | 1 | 1 |
| CASE 2 | 1 | 1 | 2 | 2 | 4 | 4 |
| CASE 3 | 1 | 1 | 4 | 4 | 16 | 16 |

In CASE1, the number of chips simultaneously tested will not change throughout the generations.

In CASE2, the number of chips simultaneously tested will double ever two generations.

In CASE3, the number of chips simultaneously tested will quadruple every two generations.

In each case, the number of chips simultaneously tested is standardized by setting the number in the 1M-bit generation to 1.

FIG. 20 shows the expected trend of the ratio of test cost to the total cost, which was obtained based on the foregoing data by using the following equation:

Test Cost=(Tester Price)×(Test Period)/(Number of Chips Simultaneously Tested)

The two major factors which prevent the reduction in test cost with the conventional test system are: (1) a considerable rise in tester price; and (2) a great difficulty in testing an extremely large number of chips simultaneously.

However, since semiconductor testing apparatus of the foregoing conventional structure have various analyzing functions for correspondingly testing various items of semiconductor integrated-circuit chips, it is difficult to provide them at a reduced price. In order to greatly increase the number of semiconductor integrated-circuit chips which can be simultaneously tested, it is also required to increase the number of expensive tester heads. Moreover, in the case where a failure is detected in a semiconductor integrated circuit, the capacity of a failure address storage memory for storing the failure address should also be increased to a great extent, resulting in the high prices of the semiconductor testing apparatus. Therefore, it was difficult to provide a semiconductor testing apparatus which can test a large number of chips simultaneously.

SUMMARY OF THE INVENTION

The present invention was achieved in view of the foregoing circumstances, and its object is to provide low-price semiconductor testing apparatus which can perform the testing of a large number of semiconductor integrated-circuit chips at a time, thereby significantly reducing the cost of the semiconductor integrated-circuit chips.

Another object of the present invention is to perform the simultaneous testing of the semiconductor integrated circuits quickly in a short period of time.

In order to overcome the technical problems mentioned above, the present invention is so constituted as to produce semiconductor testing circuit chips having an exclusive function of testing only one item of semiconductor integrated circuits. Consequently, the testing is performed by using the resulting semiconductor testing circuit chips which correspond to the item of the semiconductor integrated circuit. This can eventually reduce the cost of the semiconductor testing apparatus, for it is sufficient to equip the main body of the semiconductor testing apparatus with a low-cost general work station or like facilities.

Concretely, a constitution of the present invention is a semiconductor testing apparatus for testing semiconductor integrated-circuit chips, comprising: a plurality of semiconductor testing circuit chips having an exclusive function of testing a plurality of one item of semiconductor integrated-circuit chips; a computer for controlling said semiconductor testing circuit chips and for collecting the results of the testing of said semiconductor integrated-circuit chips; and means for connecting said semiconductor integrated-circuit chips to be tested to said semiconductor testing circuit chips.

Another constitution of the present invention is a semiconductor testing circuit chip having an exclusive function of testing one item of semiconductor integrated-circuit chip, comprising: a test-pattern generating circuit for generating a test pattern to be applied to said semiconductor integrated-circuit chip under test; a timing measuring circuit for measuring the timing with which the semiconductor integrated-circuit chip generates a waveform in response to the test pattern generated by said test pattern generating circuit; an electric current measuring circuit for measuring the electric current consumed by said semiconductor integrated-circuit chip under test; and a failure analysis circuit for analyzing the failure of said semiconductor integrated-circuit chip.

Still another constitution of the present invention is a semiconductor testing circuit chip comprising: means for generating a test pattern to be applied to a semiconductor integrated circuit under test; means for storing data outputted from the semiconductor integrated-circuit under test in response to the test pattern generated by said test pattern generating means; and means for judging whether the output data from the semiconductor integrated-circuit under test, which is stored in said data storing means, is a failure or not, said test pattern generating means, said data storing mean, and said judging means being integrated into the same chip.

Still another constitution of the present invention is a probe card comprising: a plurality of means having a function of testing a plurality of semiconductor integrated circuits on a semiconductor wafer; a plurality of probe needles for contacting with said plurality of semiconductor integrated circuits under test in a plurality of points, respectively; and the main body of a probe card for holding said plurality of means having the testing function and said plurality of probe needles.

Still another constitution of the present invention is a semiconductor testing apparatus comprising: semiconductor testing circuit chips for testing semiconductor integrated-circuit chips mounted in a computer; means for storing the test sequence of said semiconductor integrated-circuit chips under test; test result collecting means for controlling said semiconductor testing circuit chips and for collecting the results of the testing of said semiconductor integrated-circuit chips, wherein said semiconductor testing circuit chips, said means for storing test sequences, and said test result collecting means are mounted in said computer.

In the foregoing constitutions according to the present invention, the major functions of testing the semiconductor integrated circuits are incorporated into the semiconductor testing circuit chips. Hence, the computer for collecting the test results can sufficiently be composed of a low-price computer such as a work station, thereby significantly reducing the price of the semiconductor testing apparatus. Moreover, the number of chips-tested simultaneously can be increased by simply increasing the number of the semiconductor testing circuit chips to be mounted on the connected means. As a result, semiconductor chips in excess of a hundred can be tested simultaneously, so that the number of the semiconductor chips tested simultaneously can easily be increased by ten times, compared with a conventional semiconductor testing apparatus with which only four to several tens of chips can be tested at a time.

Furthermore, since the semiconductor testing circuit chips are built in the computer, it is also possible to test the semiconductor integrated circuits which are already mounted in said computer for the purpose of operating the computer.

The foregoing objects and novel features of the present invention will become more apparent from the following detailed description thereof when the same is read in connection with the accompanying drawing.

BRIEF DESCRIPTION OF THE DRAWINGS

The accompanying drawing shows preferred embodiments of the present invention, in which:

FIG. 13 is a view showing an example of the structure of the main body of a probe card;

FIG. 14 is a view showing another example of the structure of the main body of the probe card;

FIG. 18 is a block diagram showing the inner structure of a computer in which the semiconductor testing circuit chip is built in;

DETAILED DESCRIPTION OF THE PREFERRED EMBODIMENTS

EXAMPLE 1

Figure 1:
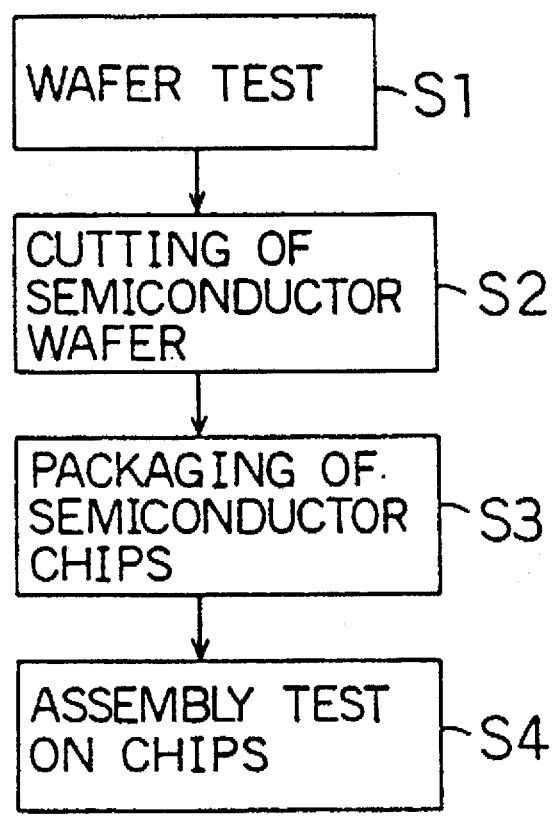
FIG. 1 is a view illustrating the type of testing performed on semiconductor integrated circuits.

Referring now to the drawing, preferred embodiments of the present invention will be described below.

FIG. 1 shows the types of testing performed on semiconductor integrated circuits. In a step S1, two types of tests are sequentially performed, which are: a wafer test for testing semiconductor integrates circuits formed on, a semiconductor wafer; and an assembly test after packaging for further testing the semiconductor integrated circuits in the form of chips. Prior to the assembly test, the semiconductor wafer is preliminarily cut into the semiconductor integrated-circuit chips, followed by the formation of electrode bumps thereon, to be packaged for use in the test.

Figure 2:
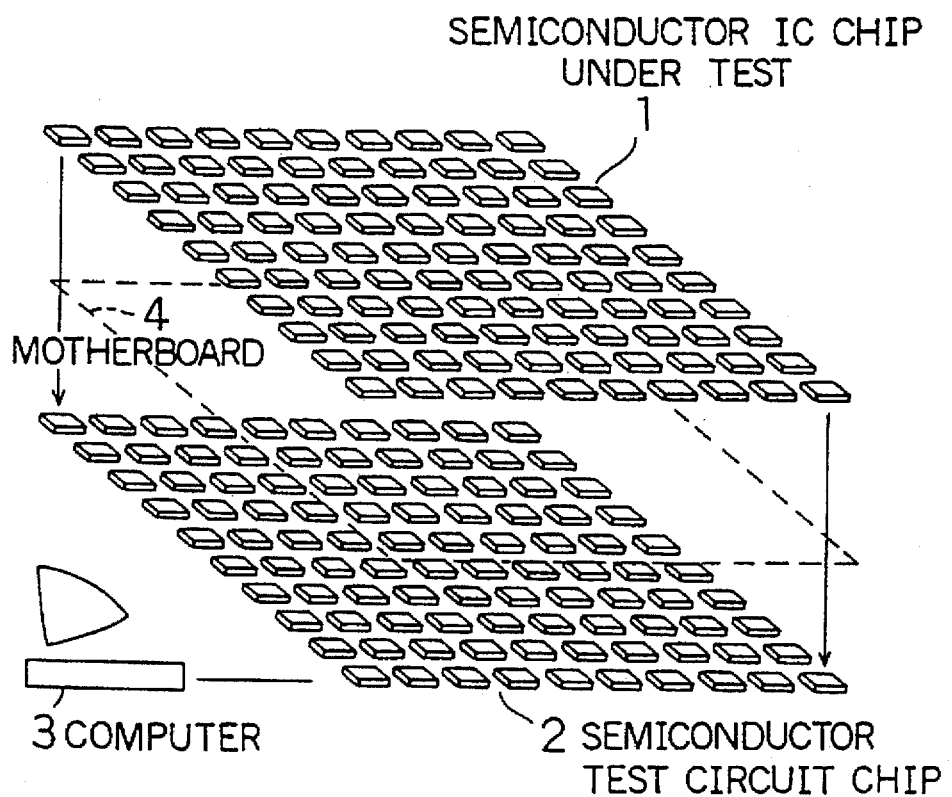
FIG. 2 is a view schematically showing the structure of a first embodiment of the present invention.

FIG. 2 is a view schematically showing the structure of a semiconductor testing apparatus used in the assembly test after packaging in a first embodiment of the present invention. In the drawing, there are shown a plurality (a hundred) of semiconductor integrated-circuit chips 1 to be tested which are arranged in an array of 10×10 and a plurality (a hundred) of semiconductor testing circuit chips 2 which are similarly arranged in an array of 10×10.

There are also shown a motherboard 4 serving as means for connecting the semiconductor integrated-circuit chips 1 to be tested to the semiconductor testing circuit chips 2. On the top surface of the motherboard 4 are disposed the semiconductor integrated-circuit chips 1 to be tested, and on the bottom surface of the motherboard 4 are disposed the semiconductor testing circuit chips 2. In the present embodiment, a hundred of semiconductor integrated-circuit chips 1 can be tested simultaneously.

Figure 3:
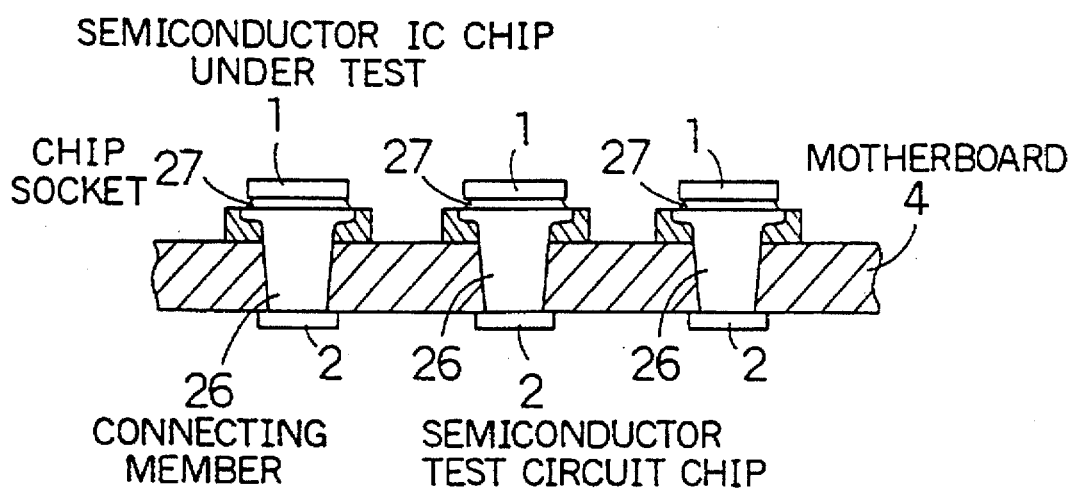
FIG. 3 is a cross sectional view of a motherboard.

As shown in FIG. 3, the motherboard 4 is provided with a plurality of connecting members 26. To the bottom surfaces of the connecting means 26 are connected the semiconductor testing circuit chips 2, respectively, while on the top surfaces of the connecting members 26 are detachably mounted the semiconductor integrated-circuit chips 1 to be tested via chip sockets 27, respectively. When a series of testing and judging is completed, the semiconductor integrated-circuit chips 1 under test are detached from the chip sockets 27, so that they are replaced by other semiconductor integrated-circuit chips 1 to be tested subsequently.

A computer 4 is connected to the semiconductor testing circuit chips 2 via wiring 25 and the motherboard 4, so as to collect the test results from the testing circuit chips 2.

Below, the testing of the semiconductor integrated-circuit chips in the present embodiment will be described.

First, the integrated-circuit chips 1 to be tested are mounted on the top surface of the motherboard 4 via the chip sockets 2. Next, an instruction on the test method and a test start instruction are directed to each of the testing circuit chips 2 from the computer 3 via the motherboard 4. Subsequently, the semiconductor testing circuit chips 2 perform the testing of their respective semiconductor integrated-circuit chips 1 according to the test method given by the computer 3. Thereafter, the test results are transmitted to the computer 3 via the motherboard 4, thereby completing the series of testing.

The structure described above of the present embodiment has the following advantages.

That is, since the function of the semiconductor testing apparatus is incorporated into each semiconductor testing circuit chip 2, the computer 3 for collecting the test results can sufficiently be composed of a low-price computer such as a work station, so that the price of the entire semiconductor testing apparatus can be reduced significantly. Moreover, the number of semiconductor chips tested simultaneously can be increased by simply increasing the number of testing circuit chips 2 to be mounted on the motherboard 4. Therefore, the number of chips tested simultaneously can easily be increased by ten times, compared with a conventional semiconductor testing apparatus. According to the present invention, it is practically possible to test a hundred of chips at a time by using a square motherboard 4 having a 50 cm side. Hence, without using a larger-scale system, the number of chips tested simultaneously can easily be increased by ten times the number of chips tested simultaneously by the conventional testing apparatus.

Also in the present embodiment, it is possible to mount a plurality of semiconductor integrated-circuit chips 1 to be tested and a plurality of semiconductor testing circuit chips 2 on the top surface and bottom surface of the motherboard 4, respectively, thereby reducing the connecting interval between the semiconductor integrated-circuit chips 1 under test and the semiconductor testing circuit chips 2. Consequently, the present embodiment performs the testing which uses a high frequency more easily than the conventional embodiment does. Furthermore, if a motherboard 4 is composed of a highly heat-insulating material, it is also possible to place the motherboard 4, on which the semiconductor chips 1 to be tested are mounted, in a thermostated layer so as to change the setting of temperature, thereby easily realizing the temperature test of the semiconductor chips 1.

In addition, since the installation area for the semiconductor testing apparatus can be reduced to one tenth of the existing area, it is possible to reduce the floor area which occupies a large proportion of the cost for introducing a semiconductor testing apparatus, resulting in the reduction in test cost.

Figure 4:
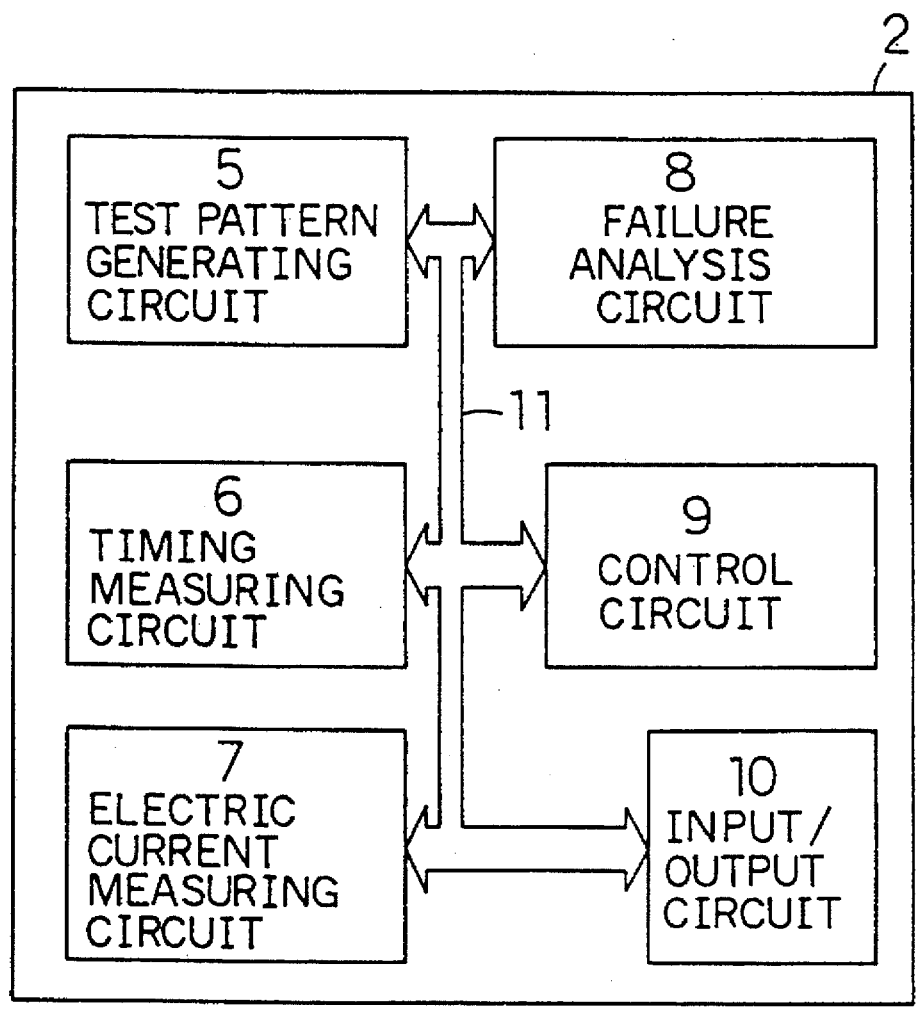
FIG. 4 is a block diagram schematically showing the inner structure of a semiconductor testing circuit chip.

Below, the inner structure of the semiconductor testing circuit chip 2 used in the aforesaid semiconductor testing apparatus will be described. FIG. 4 shows an example of the inner structure of the semiconductor testing circuit chip 2. In the drawing, there are shown a test pattern generating circuit 5 for generating a test pattern to be applied to the semiconductor integrated circuits under test, a timing measuring circuit 6 for measuring the delay time of a response waveform, or the like, which is generated by the semiconductor integrated circuit under test in response to the best pattern generated by the test pattern generating circuit 5, an electric current measuring circuit 7 for measuring the electric current consumed by the semiconductor integrated circuit under test, a failure analysis circuit 8 for analyzing the failure of the semiconductor integrated-circuit chip under test, a control circuit 9, an input/output circuit 10, and an internal bus 11 through which signals are exchanged among the circuit blocks.

The operation and structure of the foregoing elements will be described in accordance with the test flow.

In a typical semiconductor test, the semiconductor integrated circuit is tested at first for the electric current consumed thereby. If there is a disorder, the test was interrupted. In the present embodiment, a power supply voltage is supplied to the semiconductor chip 1 under test via the input/output circuit 10, so as to measure the amount of electric current flowing therethrough. The present embodiment adopts the test method shown in FIG. 5, which schematically shows the structure of the electric current measuring circuit 7 of FIG. 4.

Figure 5:
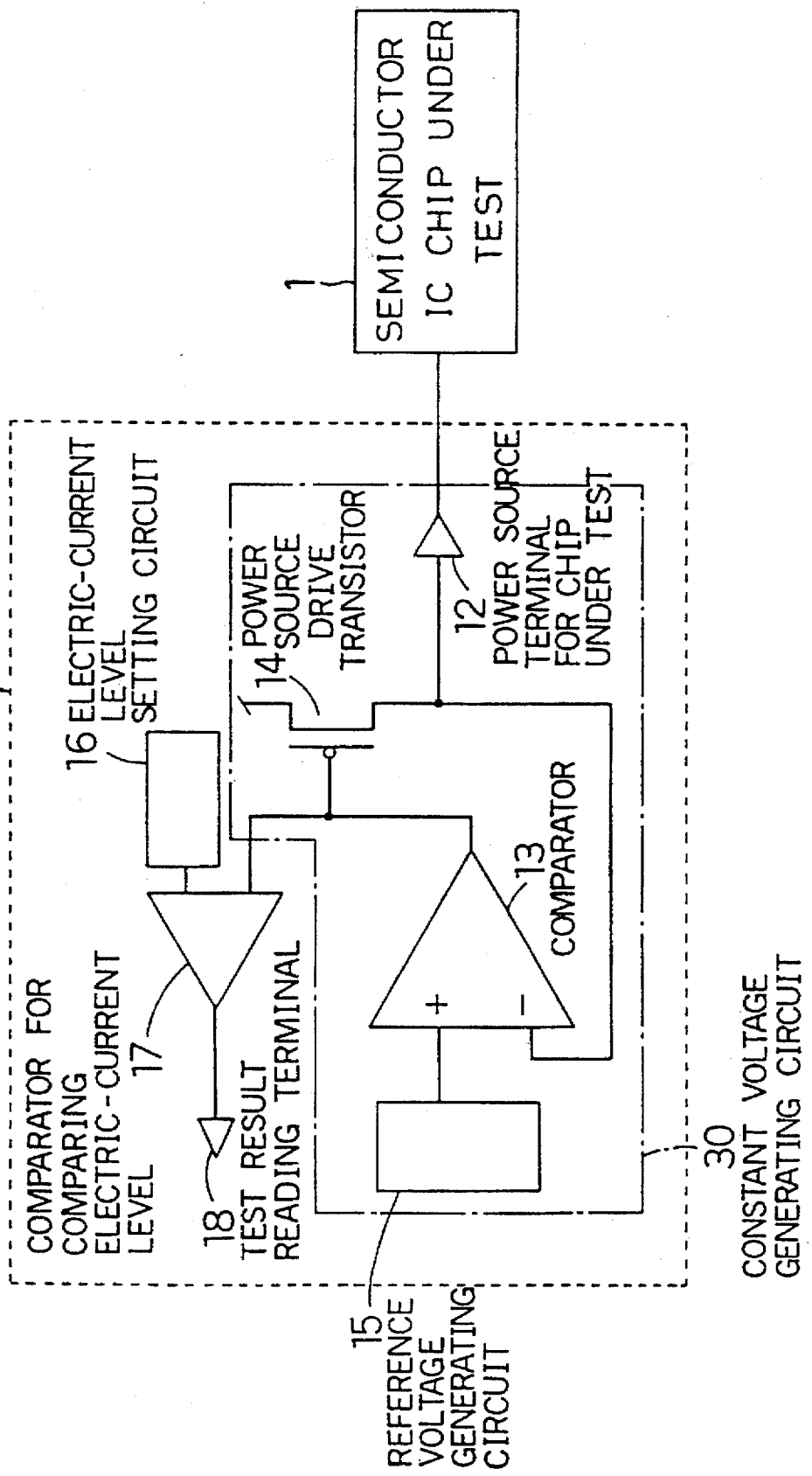
FIG. 5 is a view schematically showing an electric current testing circuit provided in the semiconductor testing circuit chip.

FIG. 5 shows a power source terminal for chips under test 12 which provides power source to the semiconductor integrated-circuit chip 1 under the measurement of electric current, a drive transistor 14 for controlling the power source current, and a comparator circuit 13 for comparing the voltage supplied to the semiconductor integrated-circuit chip 1 under test with the output of a reference voltage generating circuit 15. The power source terminal for chips under test 12, comparator circuit 13, drive transistor 14, and reference voltage generating circuit 15 constitute a typical constant voltage generating circuit 30. Furthermore, an electric-current level setting circuit 16 and a comparator for comparing electric-current level 17 are added to the present embodiment. The principle of the electric-current measurement is as follows: when the power source drive transistor 14 is of p type and hence a large amount of current is consumed, the gate voltage thereof is further lowered. The comparator 17 compares the gate voltage with the voltage generated by the electric-current level setting circuit 16, thereby detecting the level of the electric current consumed.

Subsequently, the test pattern generating circuit 5 generates a test pattern to be applied to each of the semiconductor integrated-circuit chips 1 under test. In the present embodiment, a typical ROM (Read Only Memory) is used. The resulting test pattern is allowed to pass through a delay circuit composed of a logic circuit or the like in the timing measuring circuit 6, to be compared with the waveform obtained from the semiconductor integrated-circuit chip 1 under test. The measurement of delay time or the like is conducted based on the waveform from the semiconductor integrated-circuit chip 1 under test.

The failure analysis circuit 8 compares the waveform signal outputted by the semiconductor integrated-circuit chip 1 under test with the expected value data generated by the test pattern generating circuit 5, thereby analyzing the failure of the semiconductor integrated-circuit chip 1 under test. The operation of these circuit blocks is controlled by the control circuit 9.

The semiconductor testing circuit chips 2 used in the present embodiment are produced in accordance with substantially the same design rule and fabrication processes as those of the semiconductor integrated-circuit chips 1 to be tested which are mounted on the motherboard 4, thus realizing, without difficulty, the timing accuracy required by the semiconductor integrated-circuit chips 1 to be tested.

Figure 6:
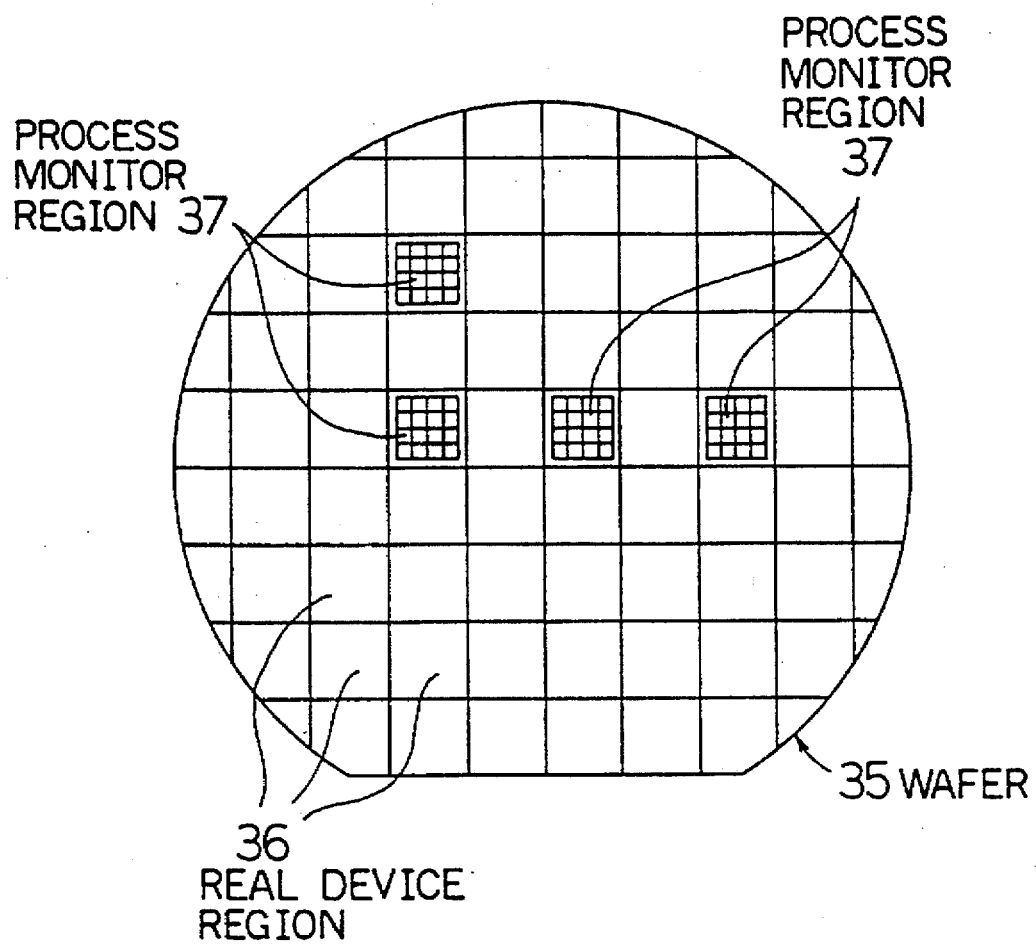
FIG. 6 is a view illustrating a process monitor region on a semiconductor wafer.

FIG. 6 shows the positions of the semiconductor testing circuit chips 2 on the semiconductor wafer in the fabrication processes. In the drawing, there are shown a semiconductor wafer 35, real device regions 36 of the semiconductor wafer 35 in which the semiconductor integrated-circuit chips 1 are produced, and process monitor regions 37 which are the portions of the semiconductor wafer 35 other than the real device regions 36. The semiconductor testing circuit chips 2 are produced in the process monitor regions 37, respectively, in the same fabrication processes for producing the semiconductor integrated-circuit chips 1. Consequently, the fabrication cost of the semiconductor testing circuit chips 2 can be reduced.

EXAMPLE 2

Figure 7:
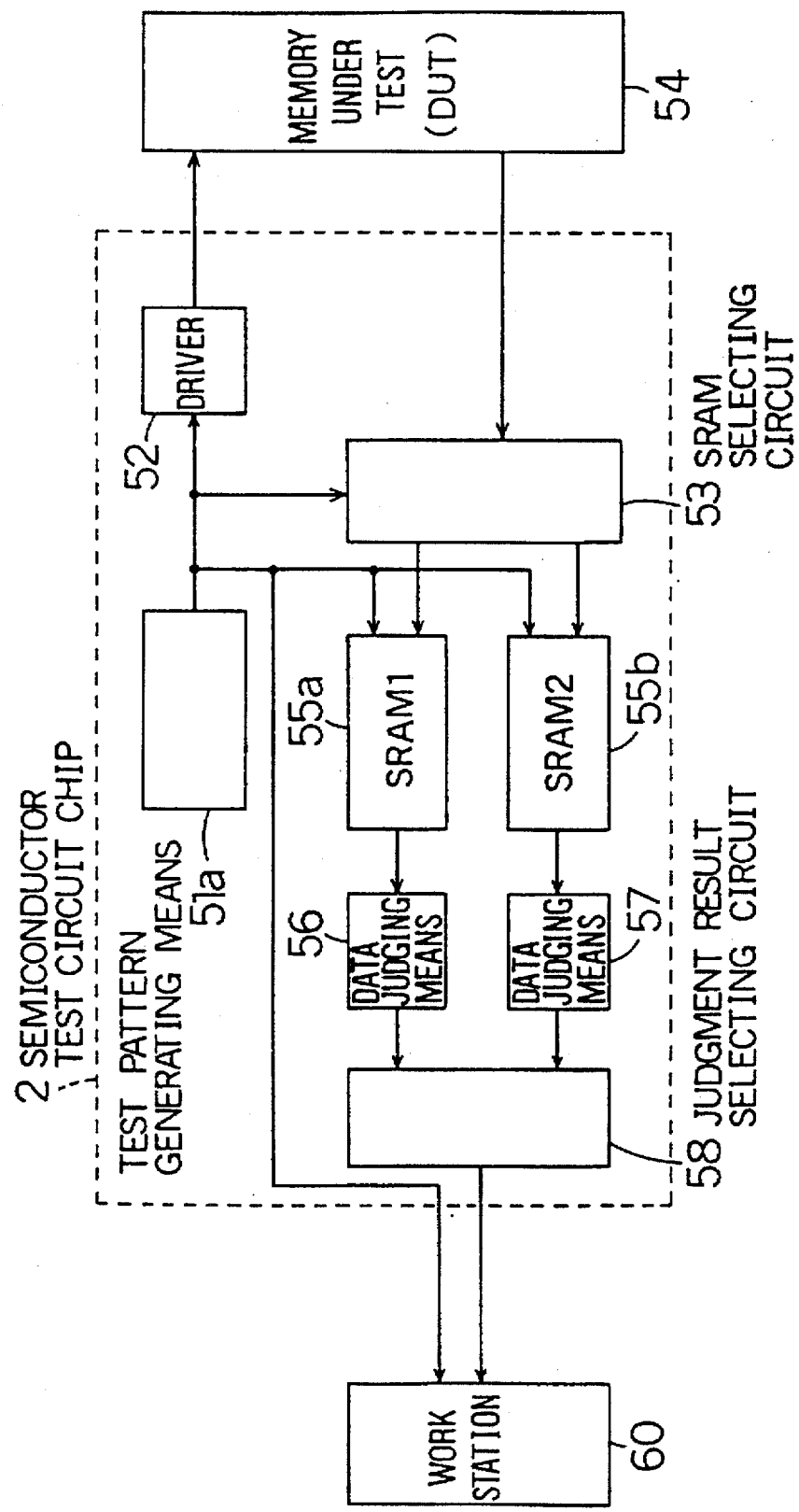
FIG. 7 is a view showing the structure of the semiconductor testing circuit chip.

FIG. 7 is a view showing another example of the structure of the semiconductor testing circuit chip of the second embodiment according to the present invention. In the drawing, there are shown the semiconductor testing circuit chips 2, a test pattern generating circuit 51a, the driver 52 for applying the test pattern generated by the test pattern generating circuit 51a to the memories 54 under test which are semiconductor integrated-circuit chips, data storing means 55a and 55b which consist of a SRAM 1 and SRAM2, respectively, and which store the output data from the memory 54 under test in response to the test pattern applied by the drive 52, a data storing means selecting circuit 53 for selecting the data storing means 55a or 55b in which the output data is to be stored, data judging means 56 and 57 for judging whether the output data stored in the SRAM 1 or SRAM 2 is a failure or not, a judgment result selecting circuit 58 for selecting one of the outputs of the data judging means 56 and 57 and for transferring it to a work station 60.

The operation of the semiconductor testing circuit chip thus constituted will be described below with reference to FIG. 7.

First, a test pattern consisting of a test address, expected value, and control signal is generated by the test pattern generating means 51a, so as to be applied to the memory 54 under test by the driver 52. The memory 54 under test outputs data corresponding to the test pattern. The data storing means selecting circuit 53 selects the SRAM1 or SRAM2, so that the output data mentioned above is stored in the selected data storing means, which is the SRAM1 in this case. After the period of transferring the address region corresponding to the SRAM1 is completed, the data storing means selecting circuit 53 selects the SRAM2, so that the output data from the memory 54 under test is stored in the SRAM 2. While the switching from the SRAM1 to the SRAM2 is conducted, a read address is generated from the test pattern generating means 51a. Among the output data stored in the SRAM1, only the output data corresponding to the read address is read by the data judging means 56, which then judges whether the output data is a failure or not. The result of the judgment is transferred to the work station 60 by the judgment result selecting circuit 58, while the corresponding read address is also transferred to the work station 60.

Figure 8A:
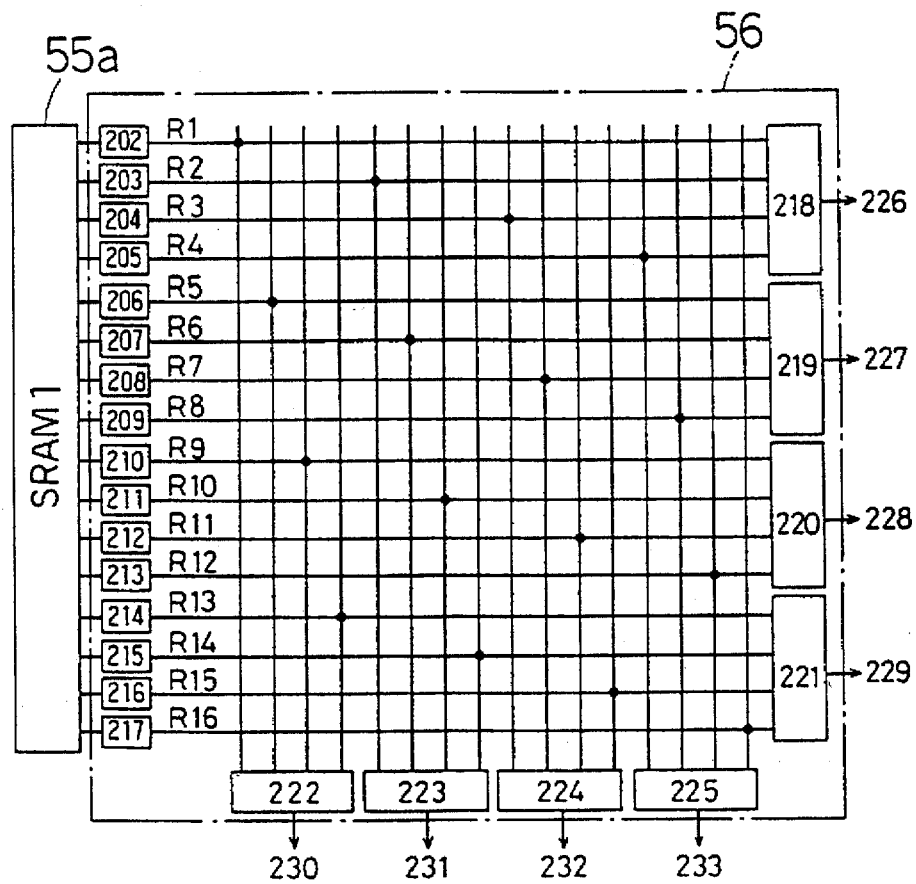
FIG. 8 is a view showing the structure of a data judging means.

FIG. 8 shows a concrete example of the data judging means, in which prefix amplifiers 202 to 217 latch and amplify the sixteen sets of data selected on the basis of the read address generated by the test pattern generating means 51a. The data R1 to R16 outputted from the prefix amplifiers 202 to 217 are connected to the judging circuits 218 to 225, respectively, in such a manner as shown in FIG. 8(a). FIG. 9 shows an example of the judging circuit 218.

Figure 8B:
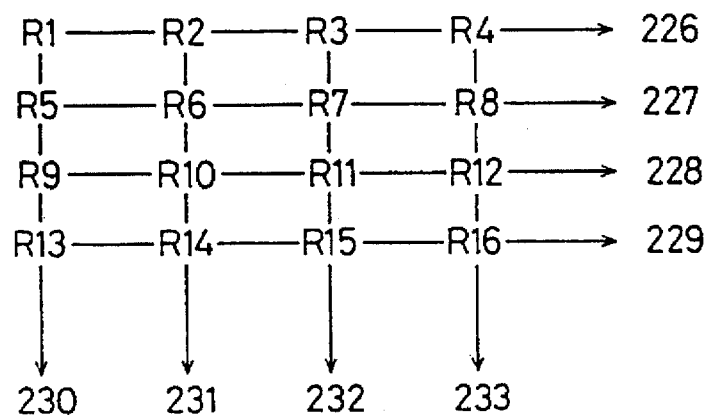
Figure 9:
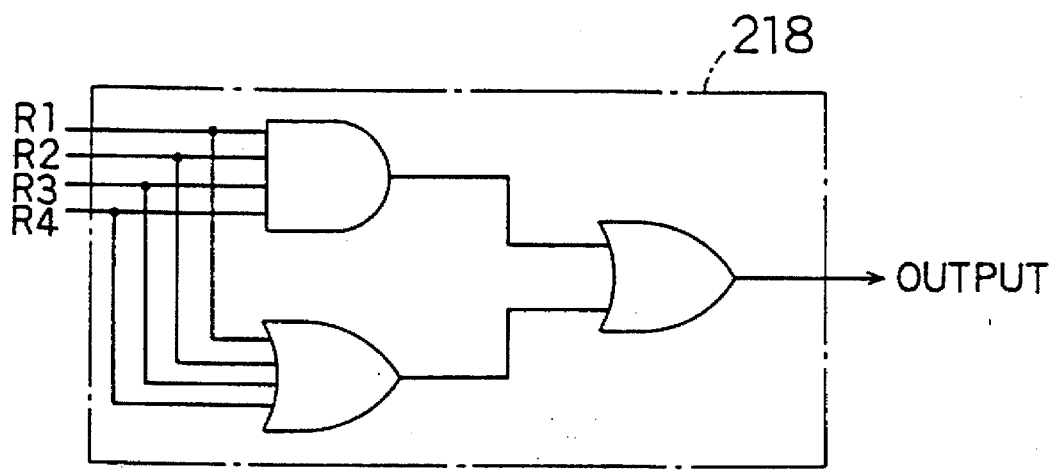
FIG. 9 is a circuit diagram of a judging circuit constitution the data judging means.

A virtual matrix of the data R1 to R16 which was obtained according to the connecting method shown in FIG. 8(a) is shown in FIG. 8(b). The matrix was obtained by sequentially collecting the 16-bit data R1 to R16 by 4 bits at a time and by arranging it in four lines so as to form a two-dimensional matrix of four rows by four columns. There are shown the outputs 226 to 229 of the judging circuits which correspond to their respective columns. HIGH levels (hereinafter referred to as "H") are outputted from the outputs 226 to 229 when all the sets of data in rows (in the horizontal direction) of the matrix of FIG. 8(b) coincide, while LOW levels (hereinafter referred to as "L") Are outputted when they do not coincide. The "H"s are outputted from the outputs 230 to 233 when all the sets of data in columns (in the vertical direction) of the matrix of FIG. 8(b) coincide, while the "L"s are outputted when they do not coincide. When the same data is written at all the addresses in the memory 54 under test, the same written data is obtained as the data R1 to R16, so that all the outputs from the judging circuits 218 to 225 become "H"s. Suppose one address, e.g. R6, is a failure in the memory 54 under test. Because the data R6 do not coincide the other data, the "L"s are outputted from the outputs 227 and 231, while the "H"s are outputted from the other outputs. Hence, it is judged that the failure address is the data R6 which corresponds to the intersection of the row corresponding to the output 227 and the column corresponding to the output 231 in the virtual matrix. Consequently, the eight sets of data from the outputs 226 to 233 and the read addresses thereof are outputted to the work station 60.

With the structure described above, it is sufficient for the speed of failure judgment to be lower than the transfer speed of the memory 54 under test. For example, if the memory 54 under test is a synchronous DRAM with the transfer speed of 100 MHz, and if the capacity of each of the SRAM1 and SRAM2 is 64 bits, the memory 54 under test requires 640 ns to transfer 64-bit data to the SRAM1 or SRAM2. If a 16-bit parallel test is executed four times in the meantime, the time allowance for each judgment is 160 ns. Since a parallel test circuit is not built in the memory 54 under test, the dimension of the chip area has no limitation, so that the judging circuit can be designed in a larger scale. Moreover, since the number of output pins is not limited, a large number of judgment results can be outputted.

Although the present embodiment showed the parallel test method which used the data judging means 56 and 57 in order to detect the coincidence or no coincidence among a plurality of sets of data, it is possible to use other methods such as a method using a vertical/horizontal parity check and a method in which a plurality of sets of data are compared with a plurality of expected values. It is also possible to use a plurality of different data judging means in combination.

Although the present embodiment showed the two data judging means 5 by way of example, the number of the data judging means 5 may be three or more.

Figure 10:
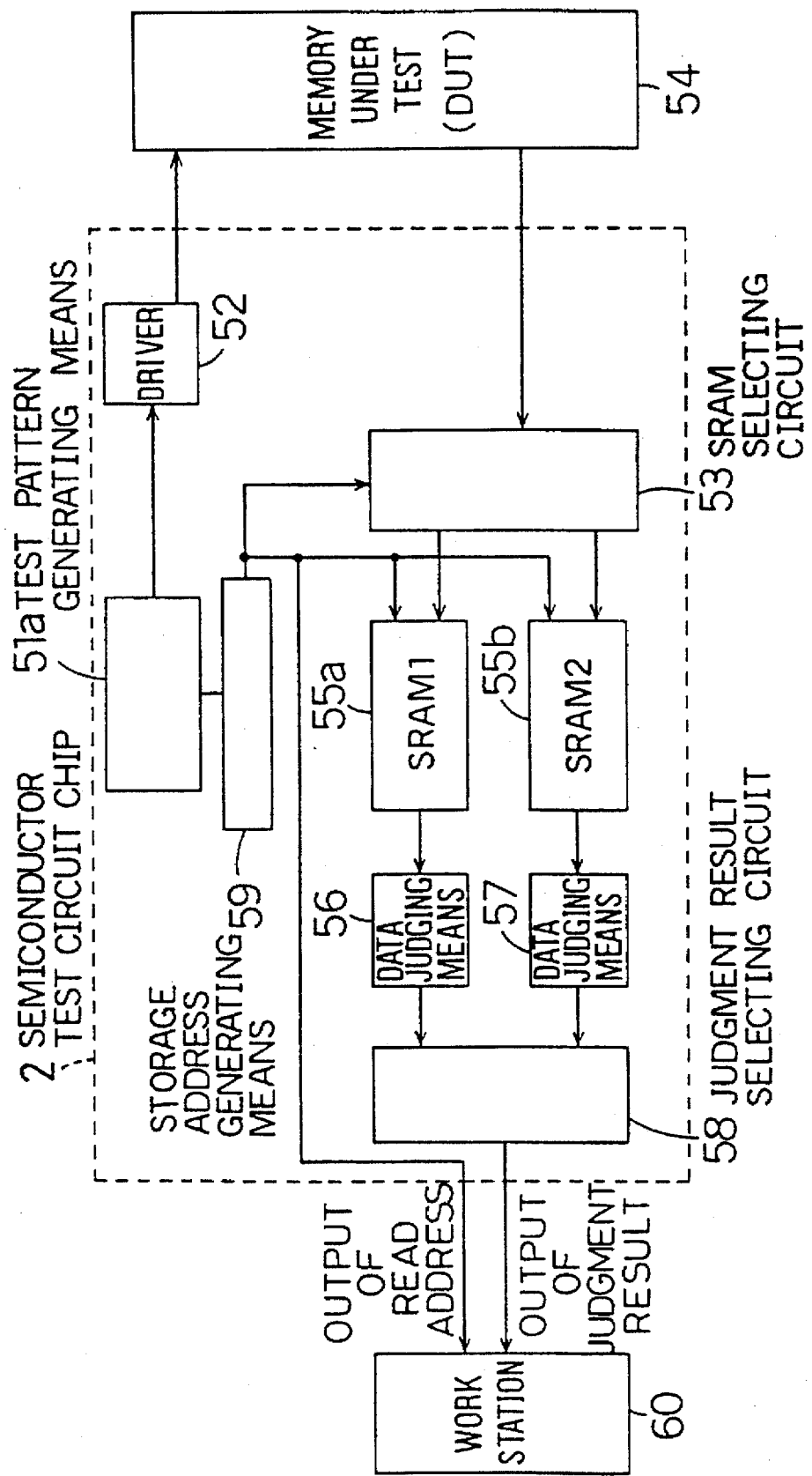
FIG. 10 is a view showing the structure of another semiconductor testing circuit chip.

FIG. 10 is a view showing the structure of another semiconductor testing circuit chip. The structure of the semiconductor testing circuit chip is basically the same as that of the foregoing embodiment, except that a storage address generating means 59 is provided. The storage address generating means 59 generates an address in the SRAM1 or SRAM 2, separately from the test pattern, when the output data from the memory 54 under test is stored in the SRMA1 or SRAM2.

The operation of the semiconductor testing circuit chip 2 thus constituted will be described below with reference to FIG. 10.

Initially, a test pattern consisting of a test address, expected value, and control signal is generated by the test pattern generating means 51b, so as to be applied to the memory 54 under test by the driver 52. The memory 54 under test outputs data corresponding to the test pattern. The data storing means selecting circuit 53 selects the SRAM1, and the output data is stored in an address in the SRAM1, which was selected by the storage address generating means 59. After the period of transferring the address region corresponding to the SRAM1 is completed, the data storing means selected by the data storing means selecting circuit 53 is switched from the SRAM1 to SRAM2. Meanwhile, the data judging means 56 judges whether the output data stored in the SRAM1 is a failure or not. The result of the judgment is transferred to the work station 60 by the judgment result selecting circuit 58.

With the structure described above, it is sufficient for the speed of failure judgment to be lower than the transfer speed of the memory 54 under test, similarly to the foregoing embodiment. Moreover, since the parallel test circuit is not built in the memory 54 under test, the dimension of the chip area has no limitation, so that the judging circuit can be designed in a larger scale. Furthermore, since the number of the output pins is not limited, a large number of judgment results can be outputted.

Figure 11:
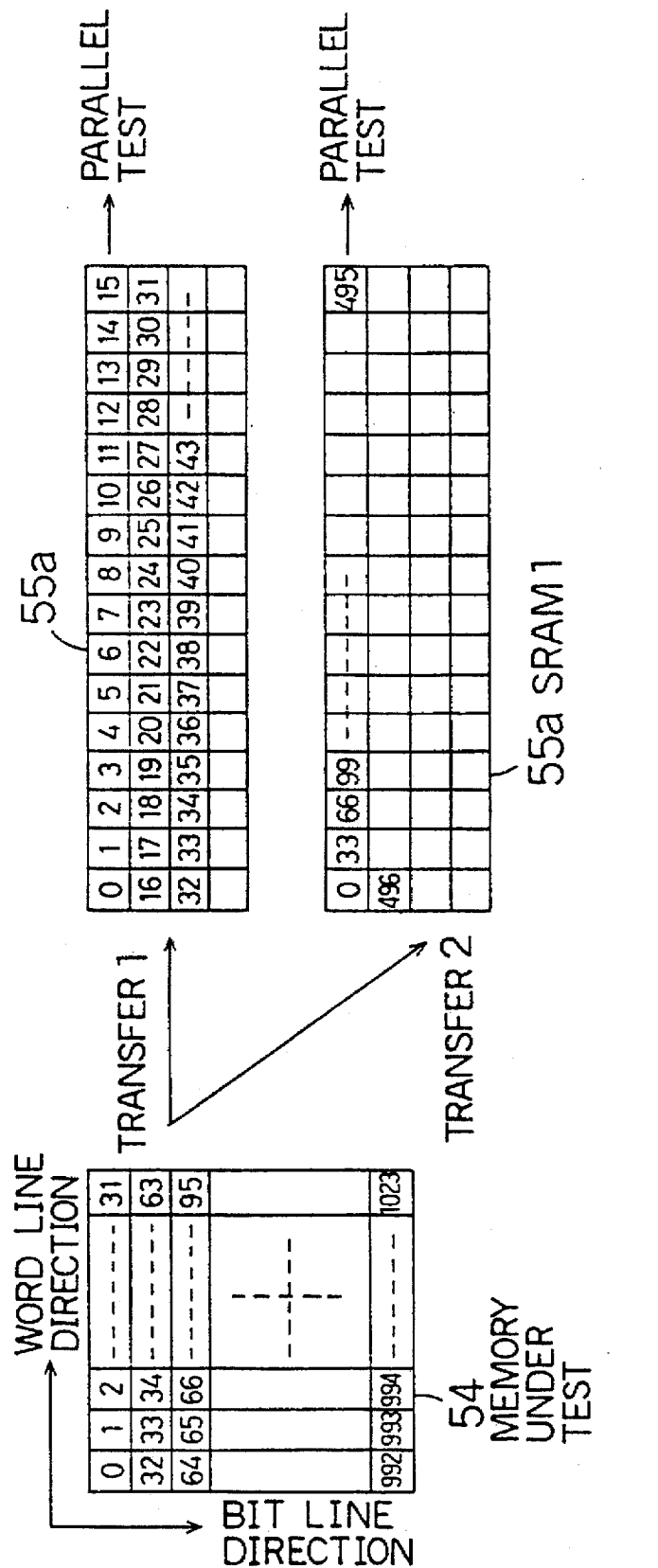
FIG. 11 is a view illustrating the operation of the semiconductor testing circuit chip.

With the structure described above, it is also possible to arbitrarily combine an address in the memory 54 under test with an address in the SRAM1 or SRAM2 at which the data obtained from the address in the memory 54 under test is stored. Consequently, even when all the sets of data tested in parallel are failures, malfunction of the parallel test circuit will be prevented. By way of example, FIG. 11 illustrates a 16-bit parallel test which uses the memory 54 under test with the capacity of 1024 bits and the SRAM 1 with the capacity of 64 bits.

In a transfer 1, the sets of data read from the memory 54 under test in the order of 1, 2, ... are sequentially stored in the SRAM1. In this case, the combinations of the sets of 16-bit data subjected to the parallel test are (0, 1, 2 to 15), (16, 17 to 31) ..., which are the data on the same word line in the memory 54 under test. If a word-line failure, which is among the failures frequently occurring in the memory 54 under test, occurs in the parallel test using such combinations, all the sets of data on the same word line become failures. Such a failure as one in which addresses 0 to 31 are all reversed is not detected.

In a transfer 2, the sets of data on a diagonal line in the memory 54 under test are sequentially stored. In this case, the sets of data subjected to the parallel test are (0, 33, 66, 99 . . . ), so that the data on the same word line is not included. As described above, the parallel test can be performed by arbitrarily combining data, so that the parallel test provides a high failure detecting ratio irrespective of the cell array structure inside the memory 54 under test.

EXAMPLE 3

Figure 12:
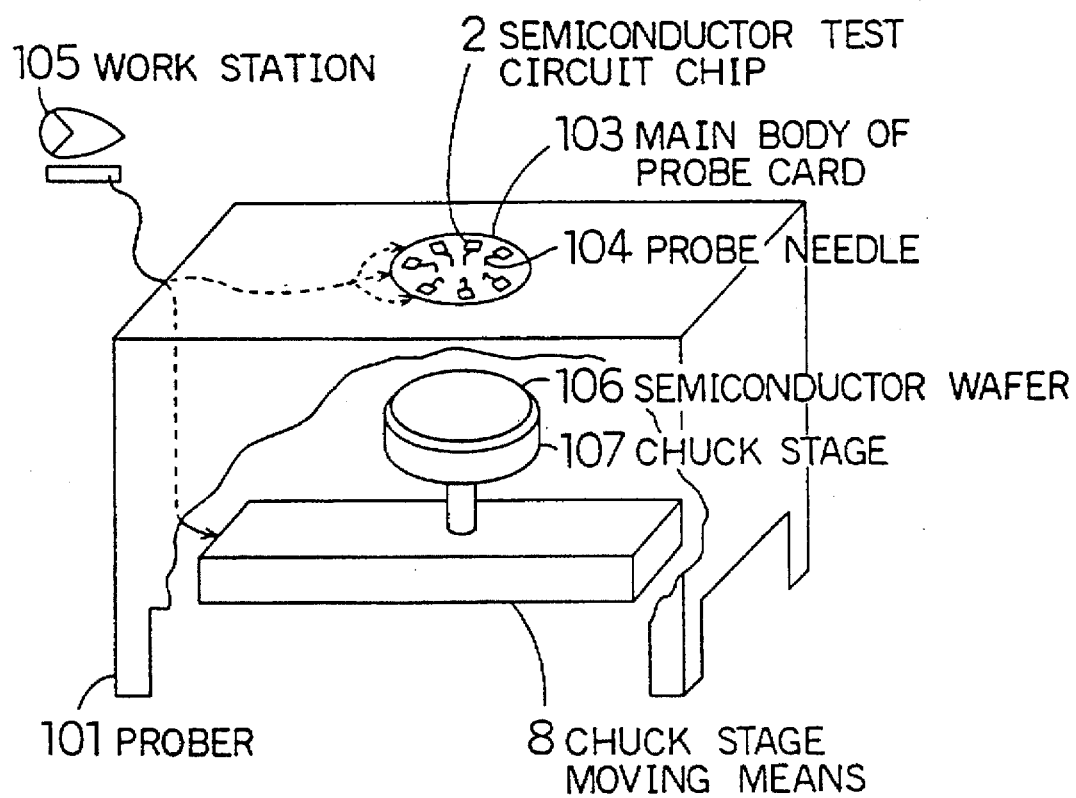
FIG. 12 is a view schematically showing the structure of a semiconductor testing apparatus used in a wafer test performed in a second embodiment of the present invention.

FIG. 12 is a view schematically showing the structure of a semiconductor testing apparatus used in a wafer test in the third embodiment of the present invention. In the drawing, there are shown the main body of a prober 101, semiconductor testing circuit chips 2 as means having the function of testing the semiconductor integrated circuits, the main body of a probe card 103 on which the foregoing semiconductor testing circuit chips 2 are mounted, a plurality of probe needles 104, a work station device 105 for controlling the whole semiconductor testing apparatus and for collecting the results of testing of the semiconductor integrated circuits, and a semiconductor wafer 106 on which the foregoing semiconductor integrated circuits to be tested are formed. The probe needles 104 are for electrically connecting the semiconductor integrated circuits under test on the semiconductor wafer 106 to the main body of the probe card 103. There are also shown a chuck stage 107 on which the semiconductor wafer 106 is disposed and a chuck stage moving means for horizontally moving the chuck stage 107.

The operation of the present embodiment will be described briefly.

Initially, the semiconductor wafer 106 on which the semiconductor integrated circuits to be tested are formed is pulled onto the chuck stage 107 by vacuum suction or the like. The semiconductor integrated circuits to be tested on the semiconductor wafer 106 are electrically connected to the semiconductor testing circuit chips 2 on the main body of the probe card 103 via the probe needles 104, respectively. When a control signal is transmitted from the work station 105 to the semiconductor testing circuit chips 2 through the prober 101 and through the main body of the probe card 103, the semiconductor testing circuit chips 2 start testing the semiconductor integrated circuits formed on the semiconductor wafer 106. The test results are transmitted back to the work station 105 by reversely following the same path mentioned above.

Below, the structure of the main body of the probe card 103 will be described.

FIGS. 13 show an example of the structure of the main body of the probe card: FIG. 13(a) is a top view of the probe card; and FIG. 13(b) is a side view of the probe card.

In the drawing, there are shown the main body of the probe card 103, the probe needles 104 for electrically connecting to the semiconductor integrated circuits under test, the bases of the probe needles 105 at which the foregoing probe needles 104 are fixed to the main body of the probe card 103, the semiconductor testing circuit chips 2 which are vertically mounted in the marginal portion of the main body of the probe card 103, and communication pins 110 for electrically connecting the main body of the probe card 103 to the main body of the whole apparatus so that data can be exchanged between the main body of the probe card 103 and the apparatus. In the main body of the probe card 103, necessary connection is provided among the communication pins 110, bases of the probe needles 105, and semiconductor testing circuit chips 2, though it is not shown in the drawing for the purpose of avoiding intricacy.

Below, another example of the structure of the main body of the probe card 103 will be described. FIGS. 14 show another example of the structure of the main body of the probe card 103: FIG. 14(a) is the top view of the probe card; and FIG. 14(b) is the side view of the probe card.

The drawing shows the main body of the probe card 103, the probe needles 104 for electrically connecting to the devices under test, the bases of the probe needles 105 at which the foregoing probe needles 104 are fixed to the main body of the probe card 103, and the semiconductor testing circuit chips 2 which are placed in positions, each overlapping one of the planes surrounded by the foregoing probe needles 104 of the main body of the probe card 103. In the present embodiment, the semiconductor testing circuit chips 2 are particularly placed in the planes surrounded by the probe needles, respectively. Unlike the case of FIG. 13, wiring is thereby installed easily in the main body of the probe card, so that the cost of producing the probe card can be reduced. There are also shown the communication pins 110 for providing electrical connection between the main body of the probe card 103 and the main body of the apparatus whereby data can be exchanged between the main body of the probe card 103 and the main body of the apparatus. In the main body of the probe card 103, necessary connection is provided among the communication pins 110, bases of the probe needles 105, and semiconductor testing circuit chips 2, though it is not shown in the drawing for the purpose of avoiding intricacy.

As described above, by using in FIG. 12 the probe card shown in FIG. 13 or FIG. 14, it becomes possible to test a considerably large number of chips at a time, which was not attainable by the prior art. Moreover, since the major function of the testing apparatus is performed by the semiconductor testing circuit chips 2 on the probe card 1, the price of the semiconductor testing apparatus can be reduced significantly.

Considering the abrasion of the probe needles, the needle portions may be formed separately from the other card portions so that the needle portions can be detached for an exchange.

Below, as an example of a low-price semiconductor wafer testing apparatus, the apparatus provided with wafer alignment detecting means will be described. In the conventional prober, the number of the semiconductor chips which can be tested at a time on a semiconductor wafer is one to several at most. The principle object of the present embodiment is to simultaneously test all the semiconductor integrated-circuit chips on a single wafer. This concept is named "Wafer Scale Concurrent Probing Scheme".

Figure 15A:
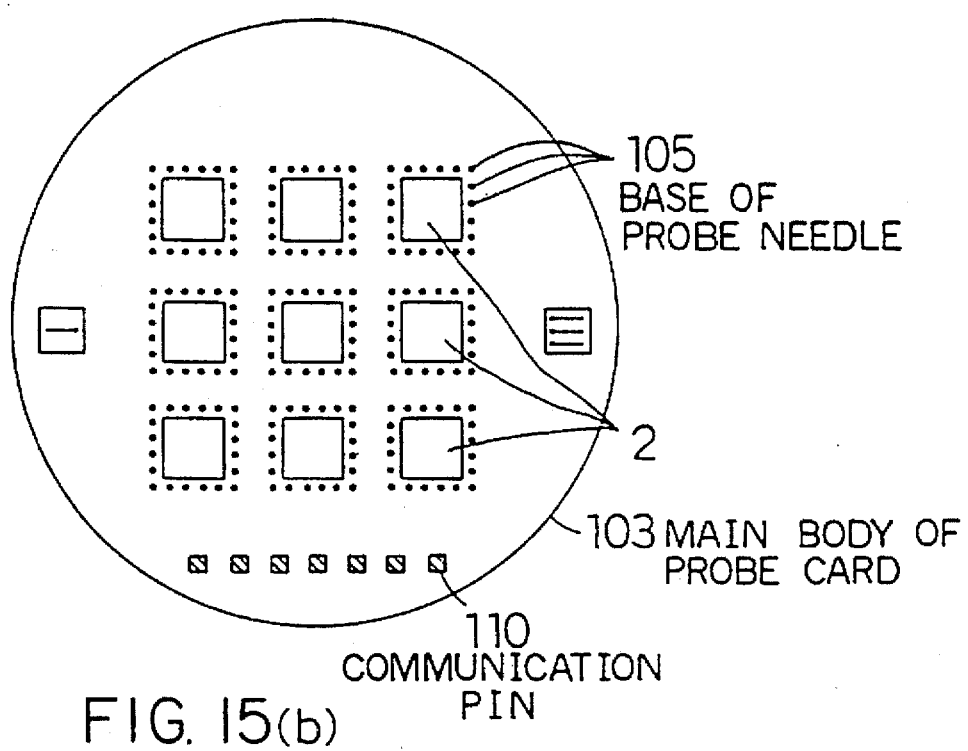
FIG. 15 is a view schematically showing an alignment system.
Figure 15B:
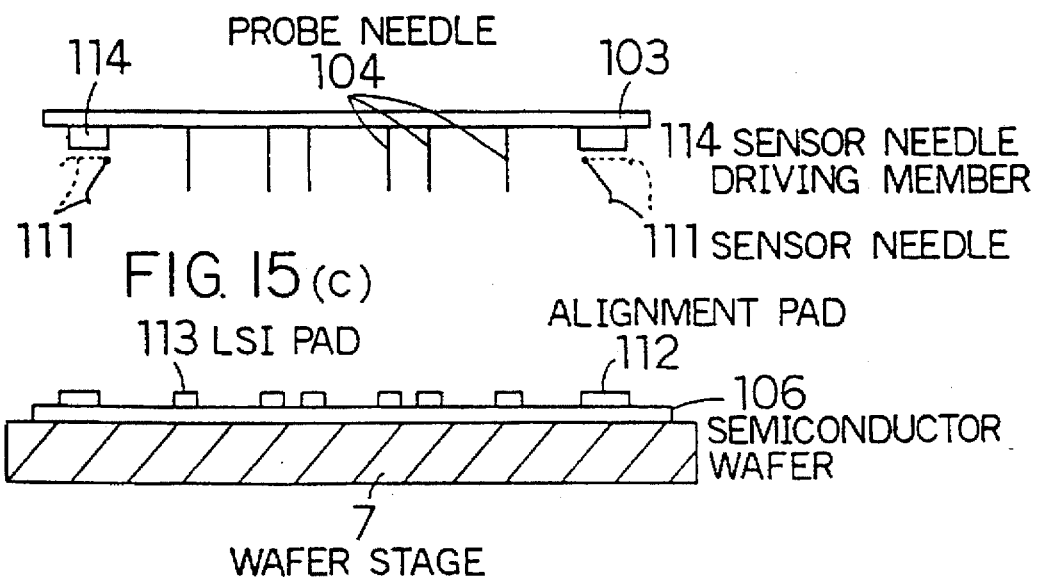

FIG. 15(a) is a top view of the probe card, FIG. 15(b) is a side view of the probe card, and FIG. 15(c) is a side view of the probe card which is disposed on a wafer stage. The structure of the probe card in the present embodiment will be described with reference to FIG. 15.

In the drawing, there are shown the main body probe card 103, the probe needles 104, the bases of the probe needles 105, the semiconductor wafer 106 on which the semiconductor chips to be tested are formed, the semiconductor testing circuit chips 2, the communication pins 110, sensor needles for alignment 111, driving members 114 for the sensor needles 111 which drive the sensor needles 111 so that their points are lower in position than the points of the probe needles 104 in time of wafer alignment and that their points are higher in position than the points of the probe needles 104 in time of testing, patterns 112 for wafer alignment which are formed on the semiconductor wafer, and semiconductor chip pads 113.

The operation of the present embodiment will be described below.

First, the semiconductor wafer 106 is roughly aligned with respect to the main body of the probe card 103 by the wafer stage 107.

Next, the sensor needles 111 are brought into contact with the surface of the semiconductor wafer 106 by the sensor needle driving members 114. At that time, the electric current flowing through the sensor needles 111 is detected so that the difference in alignment between the semiconductor wafer 106 and the main body of the probe card 103 is detected. Then the sensor needles 111 are parted from the surface of the semiconductor wafer 106 by the sensor needle driving members 114. After the wafer stage 107 moved again, the sensor needles 111 go down so that the electric current flowing through the sensor needles 111 is detected, thereby detecting the difference in alignment between the semiconductor wafer 106 and the main body of the probe card 103. After repeating the process mentioned above, the proper alignment is obtained. This time, the main body of the probe card 103 goes down so that the semiconductor testing circuit chips 2 on the probe card start testing.

Figure 16:
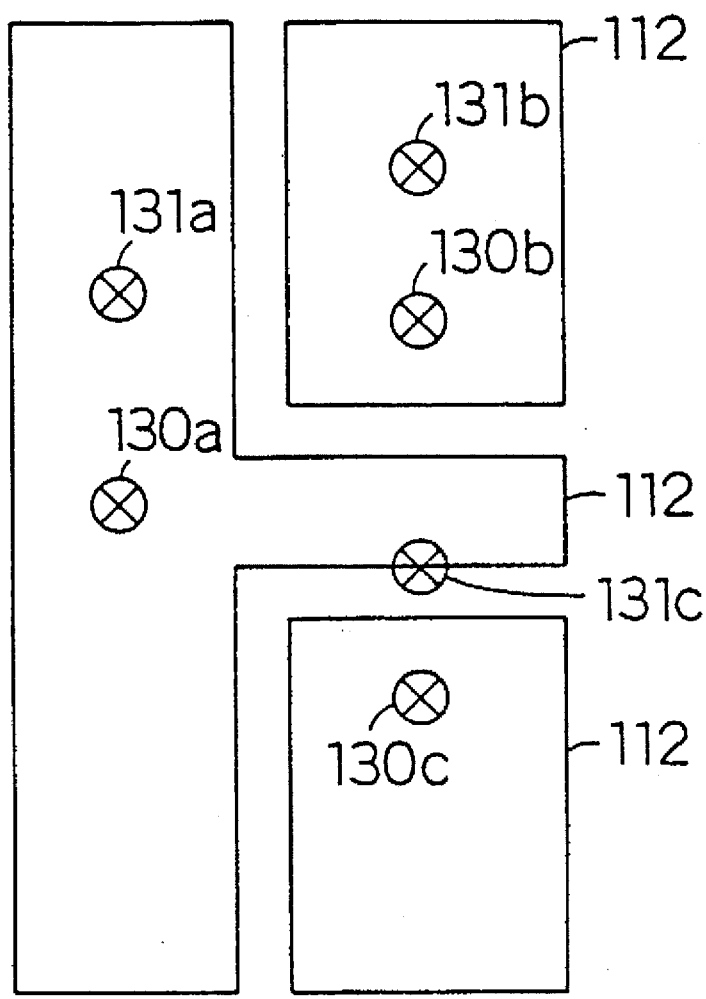
FIG. 16 is a plan view of an example of an alignment pad.

Below, the structure of the alignment pad formed on the semiconductor wafer will be described. FIG. 16 is a plan view of its concrete example. In the drawing, there are shown the pattern 112 forming the alignment pad which is composed of a metal wiring layer deposited on the semiconductor wafer 106, the contact positions 130a, 130b, and 130c of the sensor needles 111 in case of the proper alignment, and the contact positions 131a, 131b, and 131c of the sensor needles 111 in case of mal-alignment. As can be understood from the drawing, there is no electric connection among the three sensor needles 111 in case of the proper alignment, so that electric current does not flow even when voltage is applied. On the contrary, electric current flows in the case of mal-alignment. In the drawing, electric current flows particularly between the contact positions 131a and 131c, which is detected so as to change the position of the wafer stage 107 again. In the case shown in FIG. 16, detection can be performed only vertically with respect to the drawing. However if the identical alignment pad is formed on the opposite side of the semiconductor wafer, sufficient data for aligning the semiconductor wafer is collected.

Figure 17:
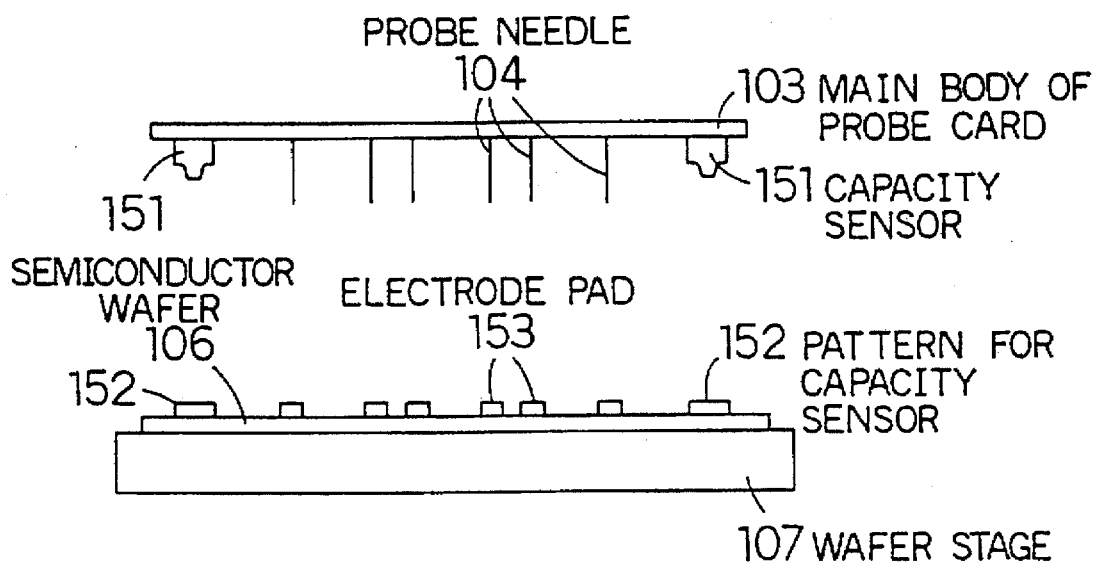
FIG. 17 is a view schematically showing another alignment system.

FIG. 17 shows a variation of the alignment detecting means, which collects data for alignment by using the variation in electrostatic capacity, instead of collecting data for alignment by detecting electric current as described above. That is, capacity sensors 150 are placed in a plurality of positions on the marginal portion of the main body of the probe card 103. A plurality of patterns 151 for capacity sensors are also formed in the marginal portion of the semiconductor wafer 7. When the capacity sensors 151 come extremely close to the corresponding patterns 152 for capacity sensors, the output of each capacity sensor 151 reaches its maximum value, thereby providing the proper alignment in which the probe needles 104 are brought into contact with the corresponding electrode pads 153 on the semiconductor wafer 106 with high precision. In this case, it is possible to omit the sensor driving members mentioned above.

EXAMPLE 4

Figure 18:
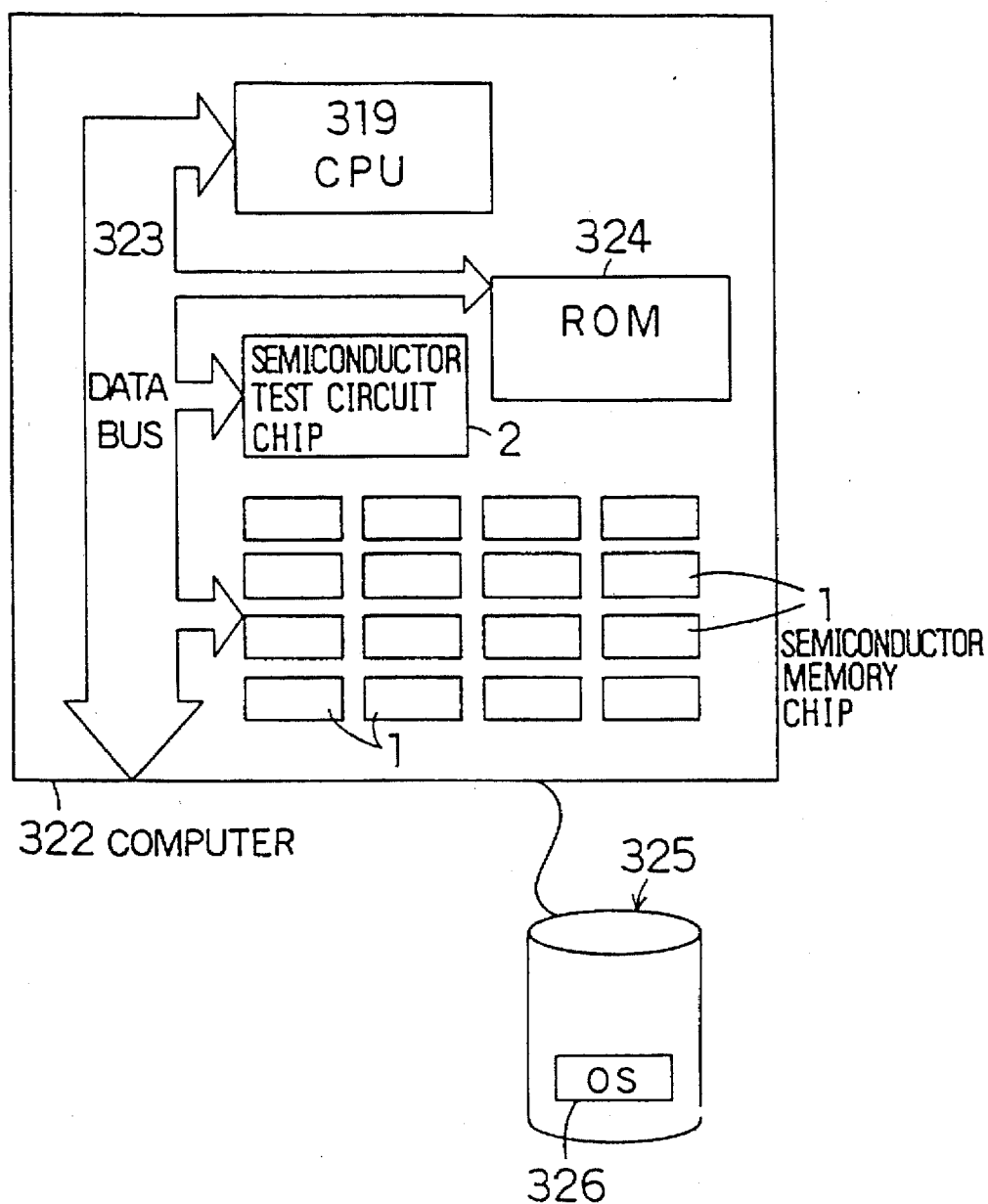
Figure 19:
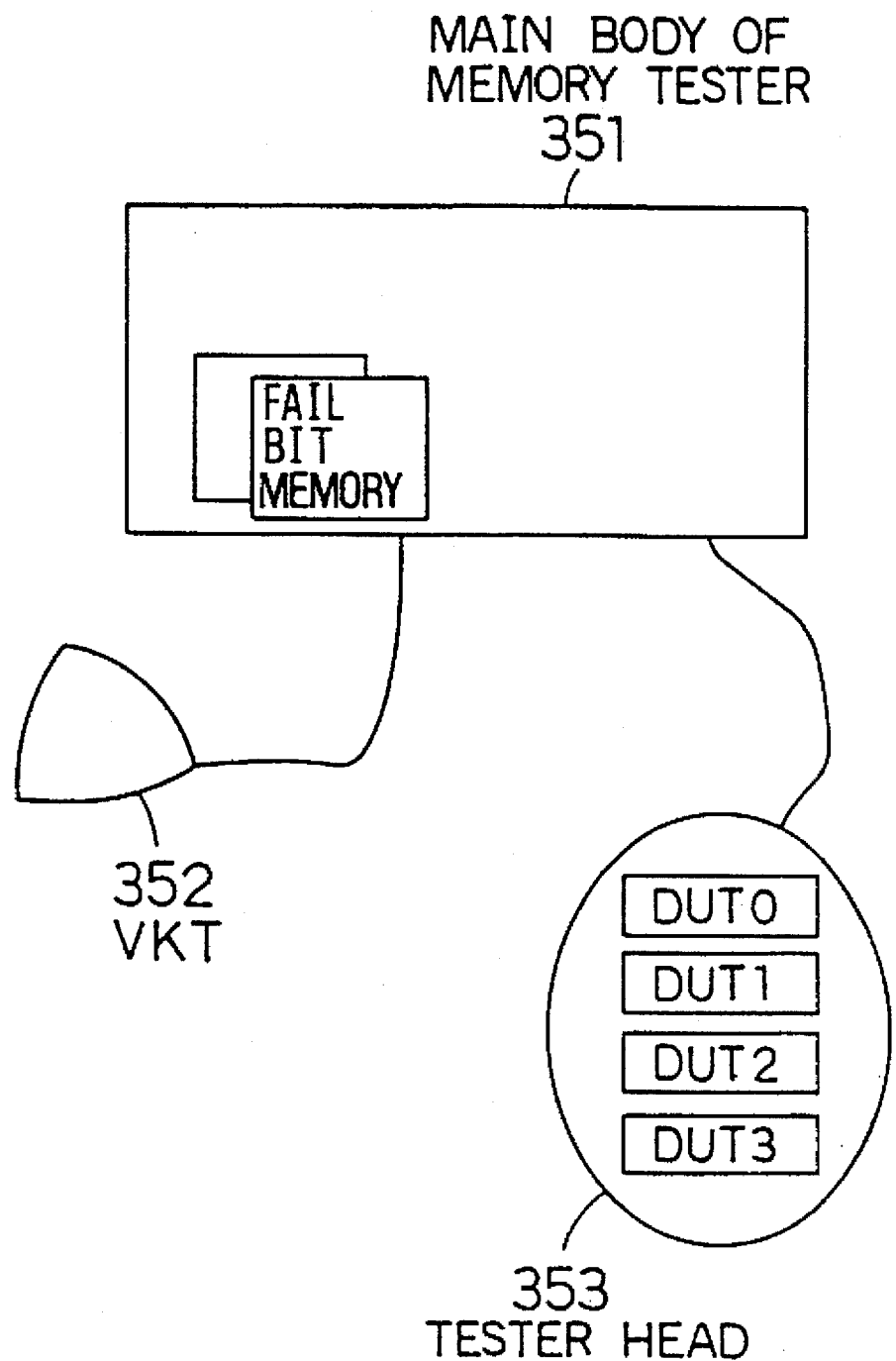
FIG. 19 is a view schematically showing the structure of a conventional memory testing apparatus.
Figure 20:
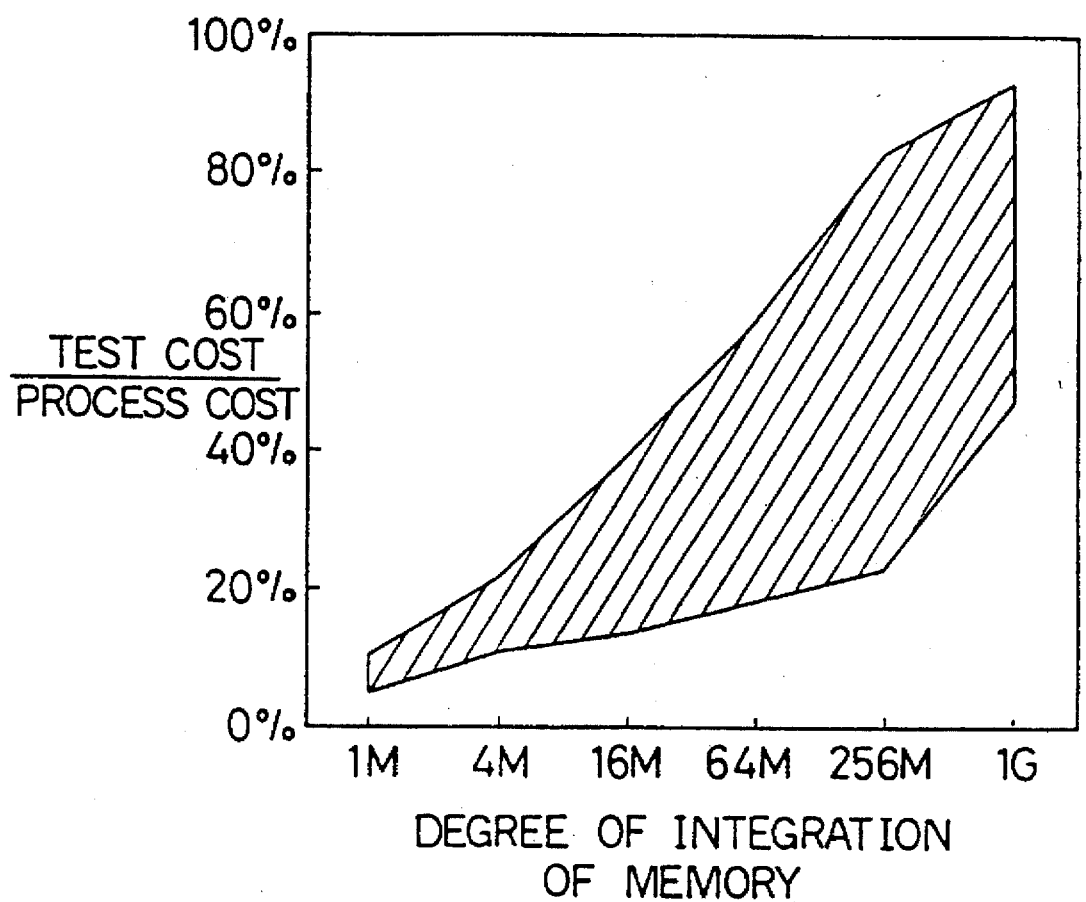
FIG. 20 is a view showing the trend of test cost in the case where the conventional memory testing apparatus is used.

FIG. 18 shows a fourth embodiment. The present embodiment is not a semiconductor testing apparatus for testing semiconductor integrated circuits in the fabrication processes thereof, but a semiconductor testing apparatus for testing semiconductor memory chips which are already built in a computer.

FIG. 18 is a view schematically showing the structure of the aforesaid semiconductor testing apparatus. In the drawing, there are shown a processor 319 of a computer equipped with the semiconductor testing apparatus, the semiconductor testing circuit chips 2 according to the present invention, a plurality of semiconductor memory chips 1 used in the processor which are to be tested as the semiconductor integrated-circuit chips, a computer 322 as a whole, the internal data bus 323 of the computer 322, and a ROM 324 serving as a storage means for storing the test sequences of the semiconductor memory chips 1. The semiconductor testing circuit chip 2 has the function of testing the semiconductor memory chip 1.

There are also shown a disk 325 and an operation system 326 which is built in the disk 325 for instructing the testing of the semiconductor memory chips 1 in a time during which the processor 319 is not conducting normal processing. When a defective semiconductor integrated-circuit chip 2 is detected by the test, the disk 325 stores the failure address thereof.

Below, the operation of the present embodiment will be described briefly. By utilizing the time during which the processor 319 does not conduct normal processing, the semiconductor testing circuit chips 2 perform the testing of the semiconductor memory chips 1 in accordance with the test sequences stored in the ROM 324.

If a failure is detected in any of the semiconductor memory chips 1, the processor 319 does not use the failure address of the semiconductor memory chip 1 and reports the appropriate time for repairing to the outside, thereby greatly improving the reliability of the computer.

We claim:

1. A semiconductor testing circuit chip having an exclusive function of testing a single semiconductor integrated-circuit chip out of a plurality of semiconductor integrated-chips being tested simultaneously, said testing circuit chip comprising:

a test-pattern generating circuit for generating a test pattern to be applied to said semiconductor integrated-circuit chip under test;

a timing measuring circuit which receives a waveform generated by said integrated-circuit chip under test in response to the test pattern generated by said test pattern generating circuit, said timing measuring circuit operative for measuring the timing of the received waveform;

an electric current measuring circuit for measuring the electric current consumed by said semiconductor integrated-circuit chip under test so as to determine a failure of said semiconductor integrated-circuit chip under test on the basis of the current consumed; and a failure analysis circuit, which receives timing data from said timing measuring circuit, for analyzing the failure of said semiconductor integrated-circuit chip under test on the basis of the timing data generated by said time measuring circuit.

2. A semiconductor testing circuit chip according to claim 1, wherein said electric current measuring circuit comprises:

a constant voltage generating circuit for applying a constant voltage to the semiconductor integrated-circuit chip under test;

an electric-current level setting circuit for generating a predetermined level of electric current in accordance with the electric current normally consumed by an operative semiconductor integrated-circuit chip and for generating a predetermined voltage corresponding to the predetermined level of electric current; and a comparing circuit operative for receiving a portion of the voltage of said constant voltage generating circuit corresponding to the magnitude of the current consumed by said semiconductor integrated-circuit chip under test, and for comparing the portion of the voltage of said constant voltage generating circuit with the predetermined voltage generated by said electric-current level setting circuit.

3. A semiconductor testing circuit chip according to claim 1, which is produced in accordance with substantially the same design rule and fabrication processes as those for semiconductor integrated-circuit chip to be tested.

4. A semiconductor testing circuit chip according to claim 1 or 3, which is produced in a process monitor region of a wafer in the fabrication processes for the semiconductor integrated-circuit chip to be tested.

* * * * *